United States Patent [19]

Boudewijns et al.

[11] Patent Number: 4,649,554
[45] Date of Patent: Mar. 10, 1987

[54] CHARGE TRANSFER DEVICE HAVING A SUBDIVIDED CHANNEL OUTPUT REGION

[75] Inventors: Arnoldus J. J. Boudewijns; Leonard J. M. Esser, both of Eindhoven, Netherlands

[73] Assignee: U.S. Philips Corporation, New York, N.Y.

[21] Appl. No.: 819,989

[22] Filed: Jan. 15, 1986

Related U.S. Application Data

[63] Continuation of Ser. No. 558,408, Dec. 5, 1983, abandoned.

[30] Foreign Application Priority Data

Dec. 7, 1982 [NL] Netherlands ................. 8204727

[51] Int. Cl.$^4$ .................. G11C 19/28; H01L 29/78
[52] U.S. Cl. .......................... 377/60; 377/62; 357/24
[58] Field of Search .............. 357/24; 377/57–63

[56] References Cited

U.S. PATENT DOCUMENTS 3,656,011  4/1972  Weinberg ............... 357/24
3,902,186  8/1975  Engeler et al. ......... 357/24
4,104,543  8/1978  Maeding ............... 357/24

Primary Examiner—Gene M. Munson
Attorney, Agent, or Firm—Robert T. Mayer; Steven R. Biren

[57] ABSTRACT

In a charge transfer device in accordance with the invention, the channel is subdivided at the area of the output into two subchannels provided with separate output gates which are clocked in phase opposition, and with separate reset gates which are likewise clocked in phase opposition. Between the output gates and the reset gates there is arranged a floating gate common to both subchannels by which signals can be read during 100% of a clock period so that no additional filtering operations for filtering out spectra of higher order are required. This output circuit can be used in applications in which high speeds and a high sensitivity are required.

2 Claims, 9 Drawing Figures

Φ₂ Φ₃ Φ₄ OG₁ FG RG₁ D        Φ₂ Φ₃ Φ₄ OG₂ FG RG₂ D
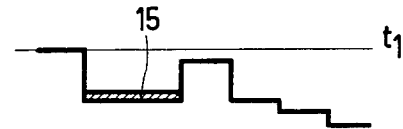 t₁  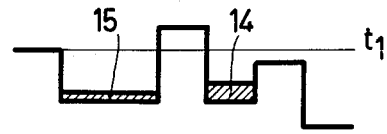 t₁
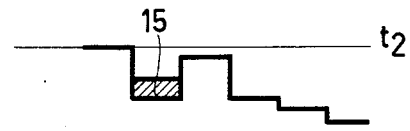 t₂  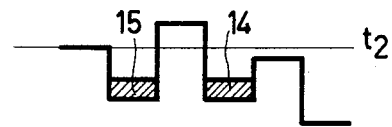 t₂
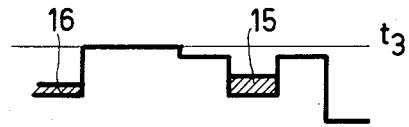 t₃  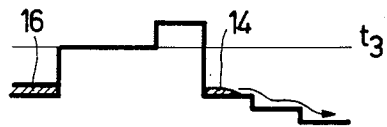 t₃
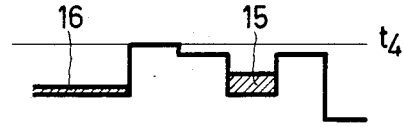 t₄  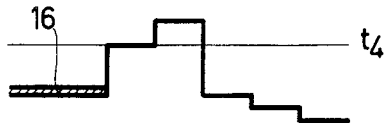 t₄
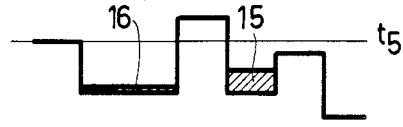 t₅  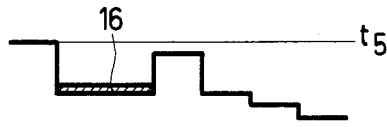 t₅
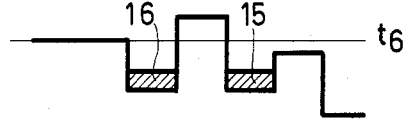 t₆  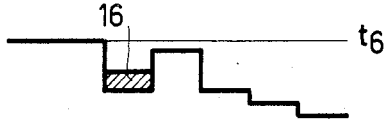 t₆
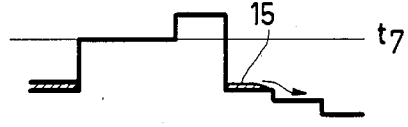 t₇  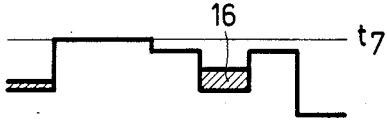 t₇
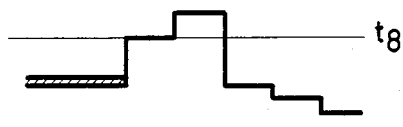 t₈  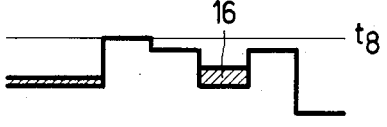 t₈
FIG.3a          FIG.3b 4,649,554

CHARGE TRANSFER DEVICE HAVING A SUBDIVIDED CHANNEL OUTPUT REGION

This is a continuation of application Ser. No. 558,408, filed Dec. 5, 1983, now abandoned.

BACKGROUND OF THE INVENTION

The invention relates to a charge transfer device comprising a row of clock electrodes defined on a surface of a semiconductor body for supplying clock voltages for transporting information-representing charge packets through a charge transfer channel in the body to a reading stage at which transported charge packets can be detected, the reading stage being so constructed such that, during at least substantially the whole clock period, output signals can be derived therefrom which are constant and representative for the information to be read.

Charge transfer devices having the features described in the first paragraph are known inter alia from "Handbook on Semiconductors", ed. T. S. Moss, Volume 4, ed. C. Hilsum, chapter 3B, pp. 397–401, FIG. 39, p.398. This publication shows an output which is known as a "correlated double sampling output". In this output, a charge packet is transported to an output diode which is first biased to a reference voltage or reset voltage. The charge packet induces a voltage variation in the diode, which is supplied to a first amplifier, especially a source follower, whose input is connected to the diode. The output of the source follower is coupled in turn to the input of the output amplifier through a switch. When the switch is closed, the signal supplied by the source follower, which is a measure of the charge packet to be read, is supplied to the output amplifier, after which the switch can be opened again. After the switch has been opened again, the diode can be brought to the reference voltage again for a next charge packet to be read. Meanwhile, the output amplifier continues to supply an output signal representative of the first charge packet. The second charge packet can be transferred to the diode and can be detected by the source follower. The switch can then be closed again, while an output signal representative of the second charge packet can be derived from the output of the output amplifier.

Rectangular signals having a width (duration) of a clock period can be derived from the output of the output amplifier. The output voltage consequently does not return between two successive signals to a reference level, as is the case, for example, with the output signal of the source follower. As is indicated in the said publication with reference to FIG. 40, the alternation between signal and reference level gives rise to spectra of higher orders of the signal at the output, which have to be eliminated entirely or in part for many applications by additional steps. In order to eliminate these signals of higher orders, expensive filters are often required. When to the contrary a rectangular output signal is supplied during the whole clock period, these spectra of higher orders are automatically suppressed to a large extent.

A disadvantage of the known device described here is the limitation in the clock frequency at which the device can be operated, which means a limitation for the bandwidth of the signals to be processed. It has been found in practice that the maximum clock frequency lies between 15 and 25 MHz. For many applications, especially in the field of video signal processing, considerably higher frequencies are required. An important cause of this frequency limitation resides in the fact that the output diode must be brought back to the reference level through a switch each time between two successive signal detections. Moreover, the switch between the source follower and the output amplifier, which switch is generally constituted by a MOS transistor, brings about a certain delay, which in case the output diode does not constitute the main limiting factor for the clock frequency, will impose a serious limitation on the maximum clock frequency.

An additional disadvantage of this switch resides in cross-talk of the clock voltage with which the switch is operated to the output signal.

An additional disadvantage of this switch resides in cross-talk of the clock voltage with which the switch is operated to the output signal.

SUMMARY OF THE INVENTION

The invention has inter alia for its object to provide a charge transfer device in which the occurrence of spectra of higher orders in the signal is prevented and which can be operated at higher clock frequencies.

A charge transfer device having the features described above is characterized in that at the area of the reading stage the charge transfer channel is subdivided into two adjacent sub-channels which are provided with separate first gates, a common second gate and separate third gates, the separate first gates provide means by which charge packets can be introduced alternately into the said subchannels, the common second gate which can be held at an electrically floating potential is coupled to an input of an output amplifier for determining the potential of the second gate and hence the size of a charge packet stored under the second gate, and the separate third gates provide means by which a charge packet stored and read under the common second gate can be transported further.

The subdivided channel renders charge detection possible during a whole clock period, as a result of which the spectra of higher orders are suppressed. The subdivision renders it possible to transport a charge packet further in one subchannel after reading, while the next charge packet is introduced into the other subchannel under the floating gate. The speed at which this is effected is entirely determined by the same charge transport process as in the remaining part of the device and is not delayed by the presence of diodes in the transport path which need to be reset anew for each signal, nor by the presence of switches in front of the output amplifier. The floating gate may be connected to a switch for applying a suitable reference voltage. However, this switch will generally not limit the speed because the floating gate need not be reset for each charge packet. In video applications, for example, the floating gate can be reset during the line retrace time.

The device also preferably comprises means which are provided for applying, in phase opposition, clock voltages to the said first gates and for applying, also in phase opposition, clock voltages to the said third gates.

BRIEF DESCRIPTION OF THE DRAWING

Embodiments of the invention will be described, by way of example, with reference to the accompanying diagrammatic drawing, in which:

FIGS. 3a and 3b show a diagram of potential distributions which occur in the charge transport channel during operation;

DESCRIPTION OF THE PREFERRED EMBODIMENTS

Figure 1:
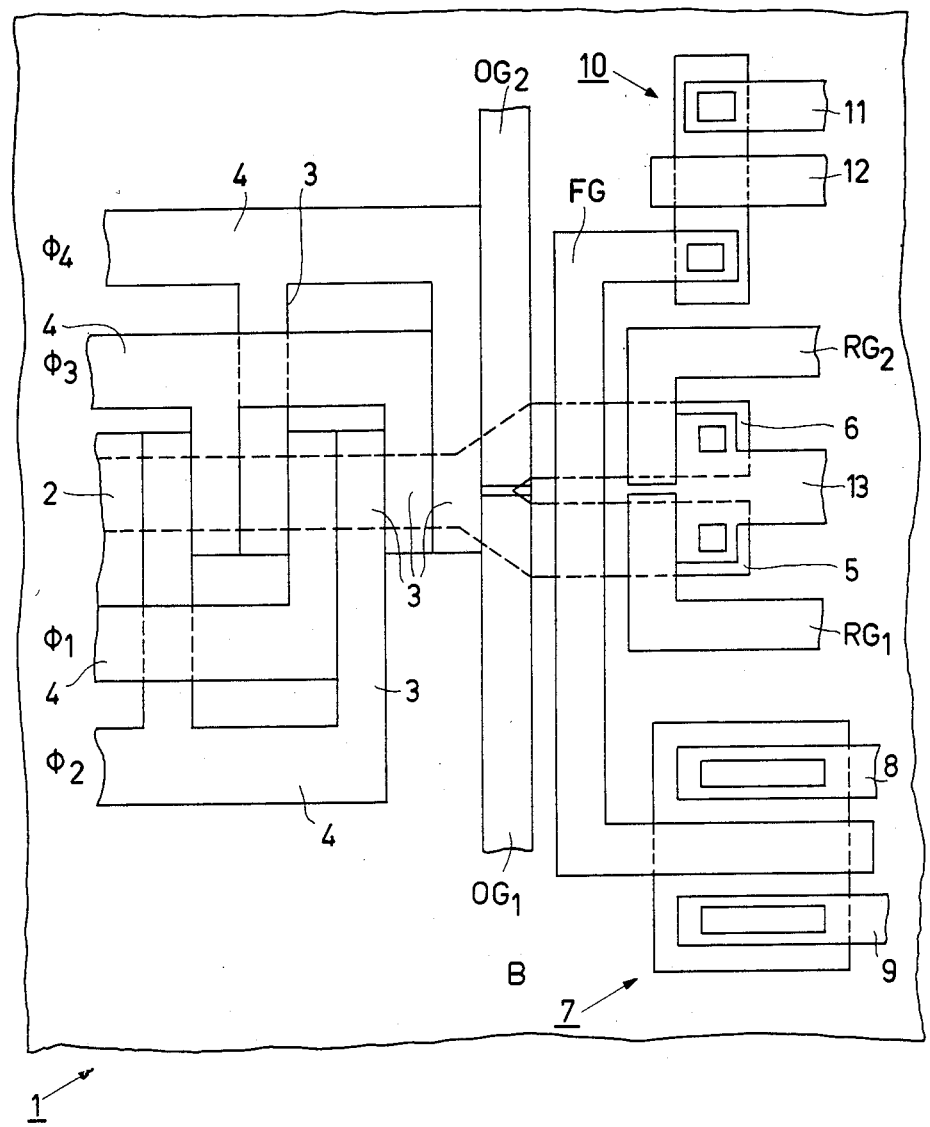
FIG. 1 is a diagrammatic plan view of a first charge-coupled device in accordance with the invention.

FIG. 1 shows a semiconductor body 1, preferably of silicon, in which a charge transfer device in accordance with the invention is formed.

Since a detailed description of the construction and the manufacture of the device is not necessary for the understanding of the present invention and since CCD technology moreover is generally known, particular technologies which can be used to manufacture this device will not be described in detail herein, it being sufficient to refer to the literature, for example, the book "Charge-Coupled Devices and Systems", ed. M. J. Howes and D. V. Morgan, chapter 2, "Fabrication Technology for Charge-Coupled devices".

The device comprises a charge transfer channel 2 which is located substantially entirely under its clock electrodes and whose lateral boundary is therefore indicated by broken lines. The channel 2 may be either of the surface channel type or of the buried channel type. In the drawing, the whole channel 2 (over its whole length) is not shown, but only a part immediately before the output of the device. The charge transport is controlled by means of a clock electrode system which in the embodiment described here is suitable for 4-phase operation. However, it should be appreciated that the principle of the invention also applied to 2-, 3- or multi-phase charge transfer devices (CTD's).

The clock electrodes 3, of which only eight are shown in FIG. 1, are arranged in groups of four, which are alternately connected to the clock lines 4 through which the clock voltages $\phi_1$, $\phi_2$, $\phi_3$ and $\phi_4$ are applied. In the figures, the clock electrodes are shown located beside each other for the sake of clarity. Actually, they may be provided, for example, in the form of an overlapping two-layer metallization, insulated from each other. For example, the electrodes 3 and the clock lines 4 to which the voltages $\phi_2$ and $\phi_4$ are applied may belong to the lower layer and the phases $\phi_1$ and $\phi_3$ may belong to the upper metallization layer. At the area at which the metallization layers cross each other, the lower layer is indicated by broken lines. All the phases $\phi_1$ to $\phi_4$, may be manufactured from polycrystalline silicon.

As has already been indicated, the device comprises a reading stage B from which output signals can be derived during substantially the whole clock period, so that at the output of the output amplifier there appears rectangular output signals whose width is equal to the clock period.

In accordance with the invention, the channel 2 is subdivided into two adjacent subchannels 5 and 6 at the area of the reading stage B. Viewed in the charge transport direction, which is assumed to be from the left-hand side to the right-hand side, the subchannels are provided with separate first gates $OG_1$ and $OG_2$, respectively. By means of these gates (Output Gates), the charge packets, which are supplied through the channel 2, can be alternately introduced into the subchannel 5 and the subchannel 6, as will be explained hereinafter. The gates $OG_1$ and $OG_2$ are followed by a second gate (FG) common to both subchannels 5 and 6. This gate, which can be held at an electrically floating potential (Floating Gate), serves, as will be apparent, for reading charge packets stored under this gate and is therefore connected to an output amplifier 7. This amplifier can simply comprise a source follower circuit, of which FIG. 1 only shows the MOS transistor, whose gate electrode is connected to the floating gate FG and whose source and drain electrodes 8 and 9 are shown diagrammatically in the drawing. Of course, other amplifier circuits may also be used. The other end of the floating gate is connected to one of the main electrode regions of a MOST switch 10, the other main electrode region 11 of which can be connected to a reference voltage. A clock signal can be periodically applied to the insulated gate electrode 12 of the MOST 10, as a result of which the floating gate FG can be brought back to the reference level. The frequency of this clock signal depends upon the speed at which the voltage at the floating gate varies (leakage paths). Since this speed is generally very low, the frequency of the clock signal at the gate electrode 12 can generally be so low that it does not limit the speed of the device.

After the floating gate FG, there are provided separate gates $RG_1$ and $RG_2$, respectively, for the subchannels 5 and 6. By means of these gates (Reset Gates), the charge packets can be transported further to a common drain contact 13 after reading.

It should be noted that the subchannels 5 and 6 in other embodiments can be joined again behind the gates $RG_1$, $RG_2$ to form a common channel identical to the channel 2 for further transporting the charge packets. Such a configuration can be used, for example, in those cases in which the charge packets have to be read several times during transport through the charge-coupled device, for example in filters.

Figure 2:
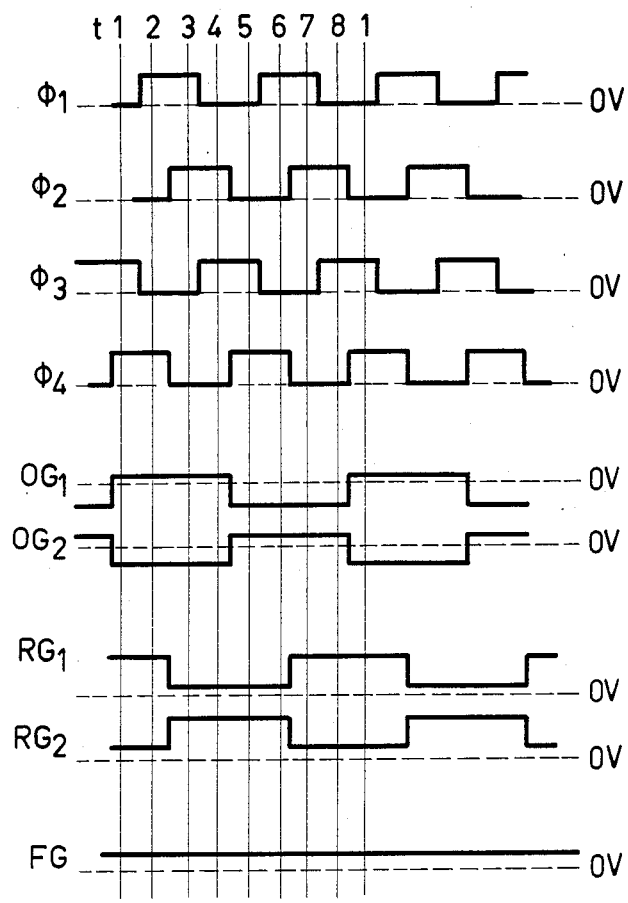
FIG. 2 shows a diagram of the clock voltages applied to the device shown in FIG. 1.

For the description of the operation of this charge-coupled device in accordance with the invention, reference is made to FIGS. 2, 3a and b and 4. FIG. 3a shows the potential distribution in the channel 2 under the last three electrodes 3 (indicated in FIG. 3 by $\phi_2$, $\phi_3$ and $\phi_4$) and in the subchannel 5. FIG. 3b likewise shows the potential distribution in the channel 2 under the last three electrodes and the potential distribution in the subchannel 6. The operation of the device will be described for an n-channel device, but it will be appreciated that the invention may also be used in a p-channel device. In FIG. 2, the clock voltages $\phi_1$-$\phi_4$ and the clock voltages applied to $OG_1$, $RG_1$ and $RG_2$ are indicated as a function of the time t. Moreover, the potential of FG is represented as a constant voltage, that is to say in the absence of charge packets under FG. The voltage level designated in FIG. 2 by "0 V" only indicates a reference level which need not necessarily coincide with ground potential. It is assumed that by means of the transistor 10 the floating gate FG is biased to a suitable potential. This voltage is chosen so that with the high voltage at $RG_1$ and the low voltage at $RG_2$ the surface potential lies under FG between the surface potentials under $RG_1$ and $RG_2$ (see FIGS. 3a and b, at $t_1$). In this situation, there is formed in the subchannel 6 under FG a potential well in which a charge packet 14 can be stored. The charge packet 14 induces a voltage variation at the floating gate FG, which can be read out through the amplifier 7. There is stored under the electrodes $\phi_3$, $\phi_4$ a next charge packet 15, which is entirely stored under $\phi_4$ at $t_2$. At the same time, $OG_1$ is at the high voltage level and $OG_2$ is at the low voltage level, as a result of which a low potential barrier is formed under $OG_1$ and a high potential barrier is formed under $OG_2$.

At $t_3$, $\phi_4$ is at the low voltage level. In the subchannel 5 the charge packet 15 flows across the low barrier under $OG_1$ into the potential well under FG. At the same instant, $RG_1$ has passed to a low voltage level and $RG_2$ has passed to a high voltage level. The charge packet 15 consequently remains under FG in the subchannel 5, while the charge packet 14 can be drained via the contact 13. The potential of FG, which was determined hitherto by the packet 14, is now determined by the size of the packet 15.

Meanwhile, a next charge packet 16 is supplied through the channel 2. At $t_4$, this packet is stored under the electrodes $\phi_2$ and $\phi_3$. At $t_5$, this packet is stored under the electrodes $\phi_3$ and $\phi_4$. During this charge transport, the packet 15 remains under the electrode FG in the subchannel 5. The gates $OG_1$ and $OG_2$ meanwhile have passed simultaneously, in phase opposition, to the low and the high voltage level, respectively, so that a higher barrier is formed under $OG_1$ than under $OG_2$. At $t_6$, the whole charge packet 16 is stored under the last electrode $\phi_4$ of the channel 2. Also at the same instant, the gates $RG_1$ and $RG_2$ are clocked to a low and a high voltage level, respectively, so that the potential profiles are as shown for $t_7$. In the subchannel 5 the charge packet 15 is drained, while simultaneously in the subchannel 6 the charge packet 16 is conducted below the gate FG so that it can be read ($t_7$, $t_8$ etc.).

Figure 4:
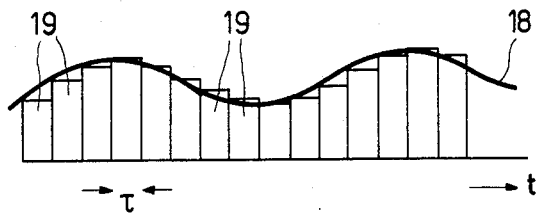
FIG. 4 shows a diagram of output signals which can be supplied by the device shown in FIG. 1.

By subdividing the charge transport channel at the area of the reading stage into two subchannels, it is therefore possible to drain a first charge packet under the floating gate FG and to store simultaneously—in the other subchannel—a next charge packet under the floating gate. The potential of the floating gate FG and hence the output signal of the source follower 7 will then have a rectangular variation as a function of time without the occurrence of a reset level between two successive signals. This is illustrated diagrammatically in FIG. 4, in which the line 18 represents the delayed input signal and the blocks 19 represent the output signal, which is the sampled and delayed input signal. The width of the blocks is equal to the clock period $\phi_1$–$\phi_4$, as a result of which spectra of higher orders in the output signal with respect to the input signal are small. The reading speed is essentially determined by the charge transport speed which in the reading section is substantially equally high as in the channel 2. Speed-limiting factors, such as reset operations, are not present so that the device can be operated at a high clock frequency and is therefore suitable, for example, for video applications. Due to the fact that the clock signals at $OG_1$ and $OG_2$, as well as the clock voltages at $RG_1$ and $RG_2$, are in relative phase opposition, as is indicated in FIG. 2, the cross-talk signals of the floating gate FG will cancel each other so that cross-talk of the clock signals at $OG_1$, $OG_2$, $RG_1$ and $RG_2$ does not or at least substantially not occur in the output signal.

It should be appreciated that the invention is not limited to the embodiment described herein, but that many other modifications are possible for those skilled in the art without departing from the scope of the invention. For example, the invention may also be used in 2-phase and 3-phase CTD's and in charge-coupled devices of the bucket brigade type (BBD).

Figure 5:
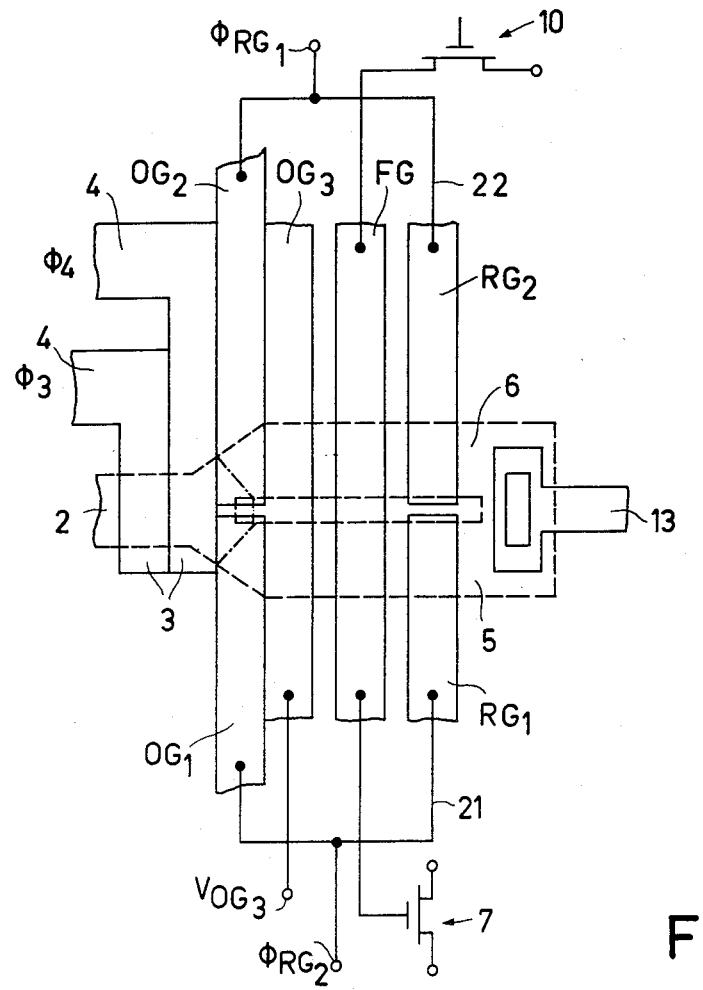
FIG. 5 is a diagrammatic plan view of an output part of a second charge-coupled device in accordance with the invention.

FIG. 5 shows in plan view a modification of the charge transfer device of FIG. 1. In the drawing, corresponding parts are designated by like reference numerals as in the first embodiment. The transistors 7 and 10 are shown only diagrammatically, as the electrical connections between various electrodes. The device shown in FIG. 5 mainly differs from the device shown in FIG. 1 in that there is arranged in the output part between the output gates $OG_1$ and $OG_2$ a further gate electrode $OG_3$, which is common to the subchannels 5 and 6. The gate $OG_3$ is connected to a fixed (d.c.) voltage $V_{OG3}$. Common clock voltages $\phi_{RG1}$ and $\phi_{RG2}$ may be applied to the gates $OG_1$, $RG_1$ and $OG_2$, $RG_2$, respectively, for which purpose the gates $OG_1$, $RG_1$ and $OG_2$, $RG_2$ are connected to each other in an electrically conducting manner through the connections 21 and 22, respectively, shown diagrammatically.

Figure 6:
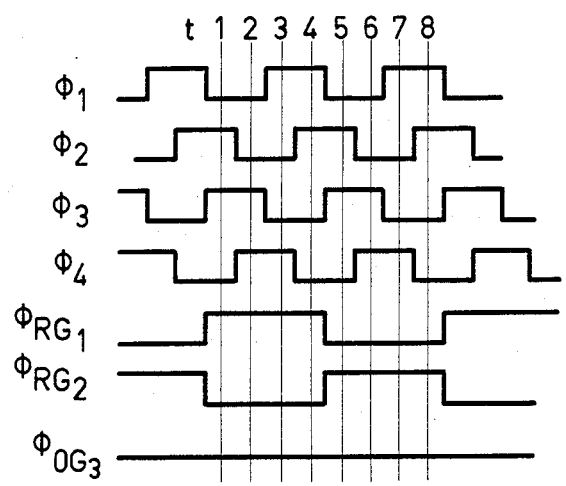
FIG. 6 shows a diagram of clock voltages applied to the device shown in FIG. 5.

FIG. 6 shows a diagram of voltages to be applied and FIG. 7 shows the potential profiles occurring in this case in the subchannels 5, 6 at eight instants $t_1$-$t_8$.

Figure 7A:
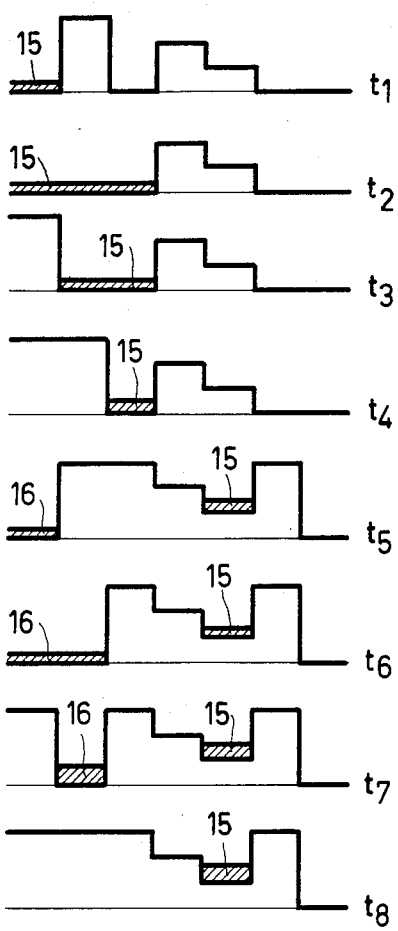
FIGS. 7a and 7b show a diagram of potential distributions which occur in the charge transport channel upon the application of the clock voltages illustrated in FIG. 6.
Figure 7B:
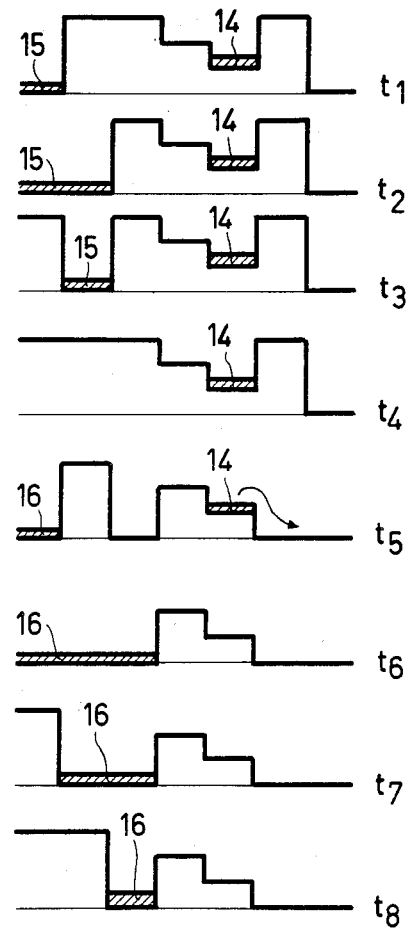

As is apparent from FIG. 7b, at the instants $t_1$-$t_4$ a charge packet 14 is present under the floating gate FG in the subchannel 6. Meanwhile, a next charge packet 15 is supplied through the charge transport channel 2. At $t_4$ this charge packet has arrived under $OG_1$ (FIG. 7a). The voltage level at $OG_1$ and $RG_1$ then decreases, as a result of which the potential (for electrons) under $OG_1$ and $RG_1$ increases. Under $RG_1$ a potential barrier is formed, as a result of which a potential well limited by the potential barriers under $OG_3$ and $RG_1$ is formed under FG (in the subchannel 5). Due to the fact that the voltage $V_{OG3}$ is chosen slightly higher than the minimum level of $\phi_{RG}$, the (constant) potential barrier under $OG_3$ is slightly lower than that under $OG_1$ and $RG_1$. Consequently, the charge packet 15 can flow from the barrier under $OG_3$ into the potential well under FG and can then be read during a whole clock period until the next charge packet 16 is stored under FG in the subchannel 6.

As the charge packet 15 is conducted under FG, the preceding charge packet 14 is drained in the subchannel 6 by reducing the potential barrier under $RG_2$ so that there substantially no time interval between the instants at which two successive charge packets are read.

In order to avoid a part of the charge flowing via $OG_2$ to the subchannel 6, during the transfer of charge from $OG_1$ to FG, the last clock electrode 4 is proportioned so that it extends partly under the electrodes $OG_1$ and $OG_2$ and up to above the subchannels 5 and 6 and forms a barrier therewith against the return of the charge between the subchannels 5 and 6. The said electrode 4, as far as it is located under $OG_1$ and $OG_2$, is indicated by dot-and-dash lines.

Compared with the first embodiment, this embodiment has the advantage that only two clocks, i.e. $\phi_{RG1}$ and $\phi_{RG2}$, are sufficient. Since moreover the instant at which $RG_1$ and $OG_1$ and $RG_2/OG_2$ are switched is not critical with respect to $\phi_4$, the time control in the present embodiment is generally somewhat less critical than in the preceding embodiment.

What is claimed is:

1. A charge transfer device, which comprises:
   a semiconductor body having a major surface and a charge transfer channel;
   a row of clock electrodes on said major surface of the semiconductor body and over said charge transfer channel;
   a reading stage for detecting transferred charge packets;
   means for supplying clock voltages to said row of clock electrodes during a clock period to transport information-representing charge pockets through said charge transfer channel to said reading stage;
   said charge transfer channel being subdivided into at least first and second adjacent subchannels at the area of the reading stage, said subchannels comprising separate first gates, a common second gate and a separate third gate, charge packets being alternately introduced into said subchannels during operation by said separate first gates, said common second gate being capable of being held at an electrically floating potential during operation and providing an output signal representative of the size of the charge packet stored beneath said second gate, and said charge packet stored beneath said second gate being further transported by said third gates;
   means for biasing said second gate at said floating potential during reading of a charge packet stored under said second gate in the first subchannel and subsequently reading a charge packet stored under said second gate in the second subchannel, so that output signals can be derived from said reading stage over substantially the whole clock period which are substantially constant over substantially the whole clock period and representative of the information to be read;
   means for applying clock voltages to said first gates in phase opposition and for applying clock voltages to said third gates in phase opposition; and
   a further gate above each of the subchannels and between the first gates and the second gate, the first gate and the third gate being conductively connected together above each subchannel.

2. A charge transfer device as claimed in claim 1, wherein said subchannels are provided with a common further gate.

* * * * *